(12) United States Patent
Lyo et al.

(10) Patent No.: US 10,145,001 B2
(45) Date of Patent: Dec. 4, 2018

(54) METHOD AND APPARATUS FOR FORMING COATING LAYER WITH NANO MULTI-LAYER

(71) Applicants: Hyundai Motor Company, Seoul (KR); Hyundai Steel Company, Incheon (KR)

(72) Inventors: In Woong Lyo, Gyeonggi-do (KR); Woong Pyo Hong, Gyeonggi-Do (KR); Kwang Hoon Choi, Gyeonggi-do (KR); Hyuk Kang, Gyeonggi-do (KR); Sang Jin Park, Gyeonggi-do (KR); Yoon Suk Oh, Seoul (KR)

(73) Assignees: Hyundai Motor Company, Seoul (KR); Hyundai Steel Company, Incheon (KR)

( * ) Notice: Subject to any disclaimer, the term of this patent is extended or adjusted under 35 U.S.C. 154(b) by 286 days.

(21) Appl. No.: 15/174,230

(22) Filed: Jun. 6, 2016

(65) Prior Publication Data

US 2017/0009331 A1    Jan. 12, 2017

Related U.S. Application Data

(62) Division of application No. 13/529,165, filed on Jun. 21, 2012, now Pat. No. 9,422,618.

(30) Foreign Application Priority Data

Nov. 30, 2011    (KR) .................... 10-2011-0126658

(51) Int. Cl.
*C23C 14/34*    (2006.01)
*C23C 14/02*    (2006.01)
(Continued)

(52) U.S. Cl.
CPC ........ *C23C 14/025* (2013.01); *C23C 14/0021* (2013.01); *C23C 14/0641* (2013.01);
(Continued)

(58) Field of Classification Search
USPC .................... 428/469, 472, 697, 698, 699
See application file for complete search history.

(56) References Cited

U.S. PATENT DOCUMENTS 5,601,293 A * 2/1997 Fukutome ........... C23C 14/0641
                                                                    277/443
6,060,182 A * 5/2000 Tanaka ................ C23C 14/0641
                                                                    428/698

(Continued)

FOREIGN PATENT DOCUMENTS

EP    2072637 A2    6/2009
GB    2296257 A    6/1996
(Continued)

OTHER PUBLICATIONS

Choi, Eun Young et al., "Comparative studies on microstructure and mechanical properties of CrN, Cr—C—N and Cr—Mo—N coatings," Journal of Materials Processing Technology, vol. 187-188:566-570 (2007).

(Continued)

*Primary Examiner* — Archene A Turner
(74) *Attorney, Agent, or Firm* — Mintz Levin Cohn Ferris Glovsky and Popeo, P.C.; Peter F. Corless

(57) ABSTRACT

Disclosed is a method and apparatus for forming a coating layer using a physical vapor deposition apparatus equipped with a sputtering apparatus and an arc ion plating apparatus, comprising: a first coating step of forming a Mo coating layer on a base material using a the sputtering apparatus and a Mo target and Ar gas; a nitrating step of forming a nitride film forming condition using an arc ion plating apparatus (Continued)

and Ar gas and $N_2$ gas; a second coating step of forming a nano composite coating layer of Cr—Mo—N using the Mo target and Ar gas of the sputtering apparatus and the Ar gas, $N_2$ gas and a Cr source of the arc ion plating apparatus at the same time; and a multi-coating step of forming a multi-layer having alternating Cr—Mo—N nano composite coating layers and Mo coating layers by revolving the base material around a central pivot.

1 Claim, 4 Drawing Sheets

(51) Int. Cl.
    *C23C 14/32*     (2006.01)
    *C23C 14/00*     (2006.01)
    *C23C 14/54*     (2006.01)
    *C23C 14/58*     (2006.01)
    *C23C 28/00*     (2006.01)
    *C23C 14/06*     (2006.01)
    *C23C 14/14*     (2006.01)
    *C23C 14/50*     (2006.01)
    *C23F 15/00*     (2006.01)

(52) U.S. Cl.
    CPC .............. *C23C 14/14* (2013.01); *C23C 14/32* (2013.01); *C23C 14/325* (2013.01); *C23C 14/345* (2013.01); *C23C 14/505* (2013.01); *C23C 14/54* (2013.01); *C23C 14/586* (2013.01); *C23C 28/322* (2013.01); *C23C 28/34* (2013.01); *C23C 28/42* (2013.01); *C23F 15/00* (2013.01)

(56) References Cited

U.S. PATENT DOCUMENTS

| | | | |
|---|---|---|---|
| 6,274,257 B1 * | 8/2001 | Aharonov | B22C 3/00 428/698 |
| 2002/0102400 A1 | 8/2002 | Gorokhovsky et al. | |
| 2007/0278090 A1 | 12/2007 | Yamamoto et al. | |
| 2009/0162153 A1 * | 6/2009 | Myrtveit | 407/113 |
| 2010/0044968 A1 * | 2/2010 | Fischer | C23C 14/0641 277/443 |
| 2010/0171272 A1 * | 7/2010 | Hoppe | C23C 14/0036 277/444 |
| 2010/0255340 A1 | 10/2010 | Ge | |
| 2013/0221621 A1 * | 8/2013 | Araujo | C23C 14/0641 277/444 |

FOREIGN PATENT DOCUMENTS

| | | |
|---|---|---|
| JP | 2004-323883 A | 11/2004 |
| KR | 10-2006-0046478 A | 5/2006 |
| KR | 10-2009-0068174 A | 6/2009 |
| WO | 97/04142 A1 | 2/1997 |

OTHER PUBLICATIONS

Zou, Y. et al., "Thermal stability and mechanical properties of sputtered Chromium-Molybdenum-Nitride (CrMoN) coatings," Journal of Achievements in Materials and Manufacturing Engineering, vol. 37(2):369-374 (2009).

Kim, Kwang Ho et al., Syntheses and mechanical properties of Cr—Mo—N coating by a hybrid coating system, Surface & Coatings Technology 2001 (2006) 4068-4072.

* cited by examiner

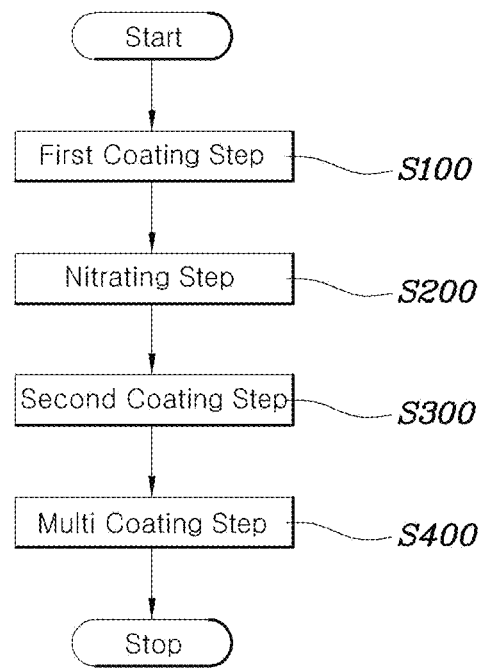
[FIG. 1]

[FIG. 2]
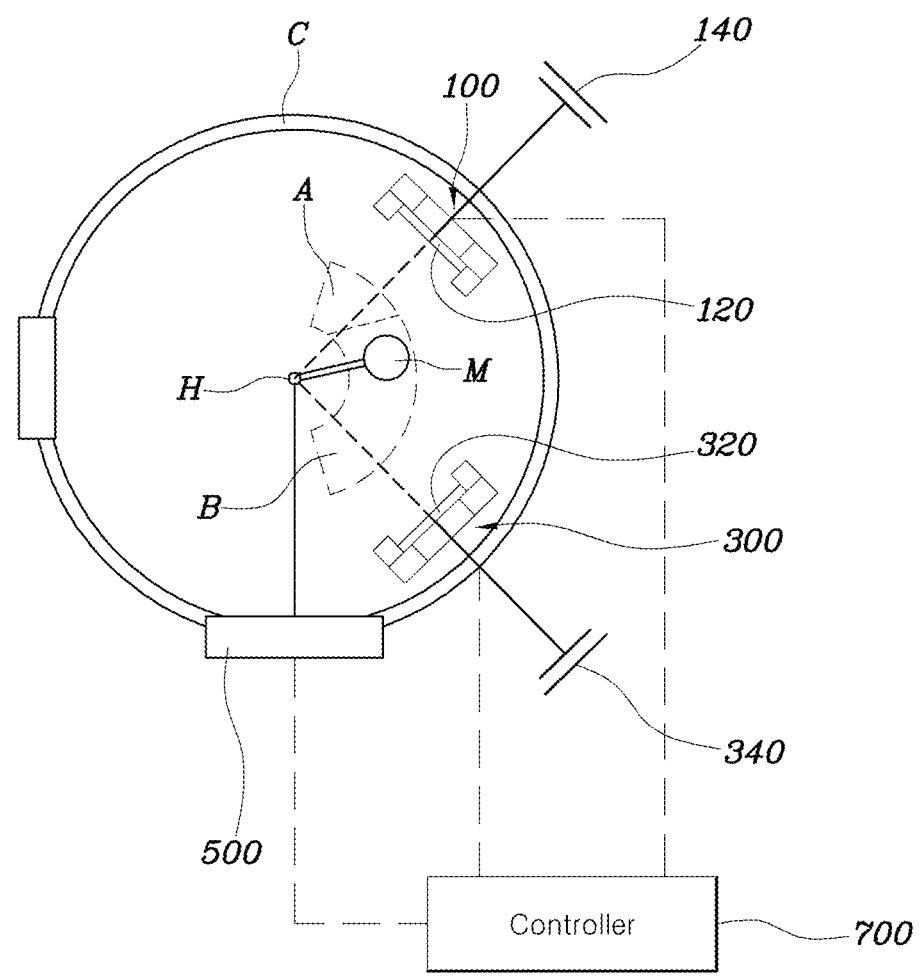

[FIG. 3]
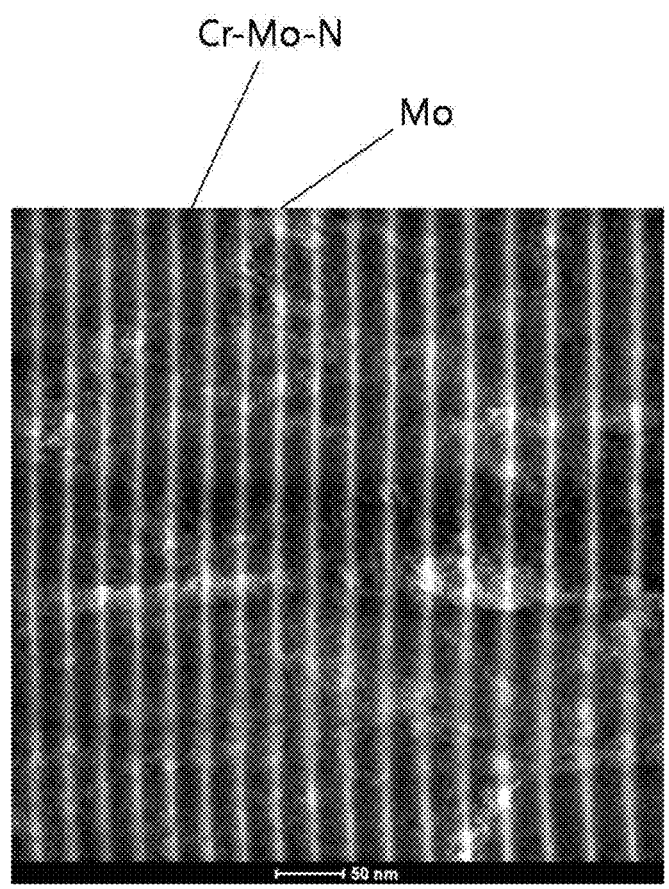

[FIG. 4]
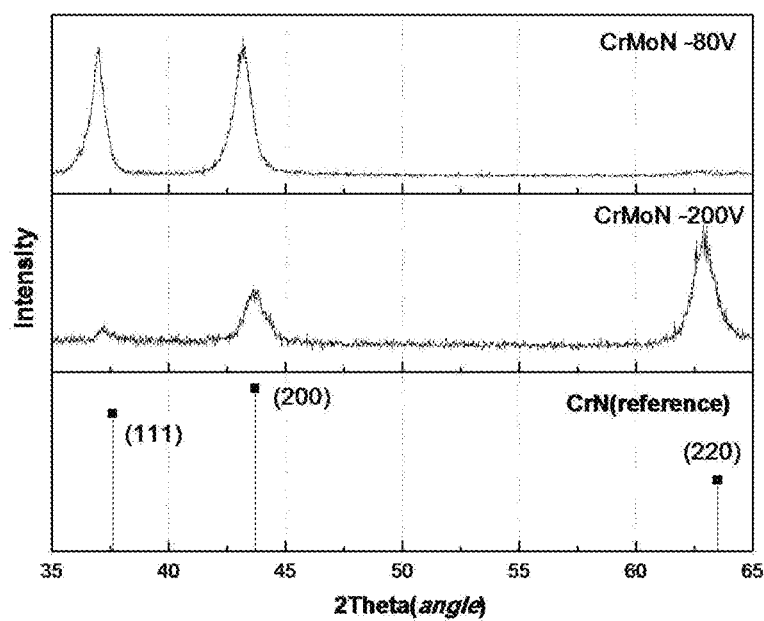

METHOD AND APPARATUS FOR FORMING COATING LAYER WITH NANO MULTI-LAYER

CROSS-REFERENCE TO RELATED APPLICATION

This application is a divisional of U.S. patent application Ser. No. 13/529,165, filed Jun. 21, 2012, which claims under 35 U.S.C. § 119(a) the benefit of Korean Patent Application No. 10-2011-0126658 filed Nov. 30, 2011, the entire contents of which are incorporated herein by reference.

BACKGROUND (a) Technical Field

The present invention relates to a method and an apparatus for forming a coating layer with a nano multi-layer, particularly a method and apparatus which controls the direction of crystal growth so as to improve the corrosion resistance and electrical conductivity of a coating layer.

(b) Background Art

In general, a plasma coating technique is used to coat a $3^{rd}$ material onto an untreated material using plasma phenomenon under a vacuum condition so as to add mechanical and functional characteristics that the untreated material does not possess. Plasma coating techniques are commonly divided to CVD (Chemical vapor deposition) and PVD (Physical vapor deposition).

Among PVD techniques, vacuum deposition, sputtering, ion plating and the like are broadly used. Ion plating is further classified to various coating methods according to the plasma activation method and coating material ionization methods.

Arc ion plating is a technique in which a coating material (target) is vapor ionized as a negative electrode using arc discharge. This technique has been beneficially used for producing hard coatings because it provides a rapid coating rate due to its rapid evaporation rate, thus providing good productivity as well as high ionization, and high crash and migration energies.

However, while the coating material formed by arc ion plating generally has excellent corrosion resistance, it has low electrical conductivity, which is problematic. For example, while CrN formed using an arc ion plating technique has excellent corrosion and wear resistant properties, it is low in electrical conductivity. In attempt to improve the electrical conductivity, a $Cr_2N$ phase has been formed on a CrN coating layer, and the resulting coating has been used as a surface coating material for a component requiring corrosion resistance and electrical conductivity, such as a fuel cell separator. However, the electrical conductivity provided by such coatings is somewhat insufficient.

What is needed is a coating layer and a method for forming a coating layer which provides a base material with improved corrosion resistance and electrical conductivity.

The information disclosed in this Background of the Invention section is only for enhancement of understanding of the general background of the invention and should not be taken as an acknowledgement or any form of suggestion that this information forms the prior art already known to a person skilled in the art.

SUMMARY OF THE DISCLOSURE

The present invention has been made in an effort to solve the above-described problems associated with prior art. It is an object of the present invention to provide a method and an apparatus for forming a coating layer with a nano multi-layer. In particular, it is an object of the present invention to provide a method and an apparatus for forming a coating layer with a nano-multi layer in which the direction of crystal growth is controlled so as to improve the corrosion resistance and electrical conductivity of the thus formed coating layer. More particularly, it is an object of the present invention to improve the corrosion resistance and electrical conductivity of a coating layer by applying a functional metal having excellent conductivity on a CrN coating layer to form a multi-layer of the CrN coating layer and the functional metal, wherein direction of crystal growth is controlled during the coating process.

According to an aspect of the present invention, a method and apparatus for forming a coating layer with a nano multi-layer is provided. In particular, a method and apparatus is provided for forming the coating layer using a physical vapor deposition apparatus equipped with a sputtering apparatus and an arc ion plating apparatus. The method may comprise: a first coating step of forming a Mo coating layer on a base material, particularly by using the sputtering apparatus and a Mo target and Ar gas; a nitrating step of forming a nitride film forming condition, particularly by using the arc ion plating apparatus and Ar gas and $N_2$ gas; a second coating step of forming a nano composite coating layer of Cr—Mo—N on the base material, particularly by using the Mo target and Ar gas of the sputtering apparatus and the Ar gas, $N_2$ gas and Cr source of the arc ion plating apparatus at the same time; and a multi-coating step of coating to form a multi-layer having repeated layers of Cr—Mo—N nano composite coating layer and Mo coating layer, particularly by revolving the base material around a central pivot within the chamber.

According to various embodiments, in the multi-coating step, an angle between central axes of the sputtering apparatus and arc ion plating apparatus can be maintained to about 60~120°.

According to various embodiments, in the multi-coating step, the bias voltage added to the base material can be about −250~−150 V.

According to various embodiments, in the multi-coating step, the flow rate of the Ar gas of the sputtering apparatus can be controlled to about 60 sccm, and the flow rates of the Ar gas and $N_2$ gas of the ion plating apparatus can be controlled to about 20 sccm and 40~100 sccm, respectively.

According to various embodiments, in the multi-coating step, the power of the sputtering apparatus can be controlled to about 50~1000 W.

According to various embodiments, in the multi-coating step, the temperature in the chamber can be maintained to about 150~350° C.

According to another aspect, an apparatus for forming a coating layer with a nano multi-layer is provided which comprises: a chamber, the chamber being configured and arranged to house a base material such that the base material can revolve on its own axis and around an interior axis of the chamber at the same time; a sputtering apparatus which is configured and arranged to provide a Mo target and Ar gas in the chamber to a certain range; an arc ion plating apparatus which is configured and arranged to provide Ar gas, $N_2$ gas and a Cr source in the chamber to a certain range; and a controller for controlling the chamber, the sputtering apparatus and the arc ion plating apparatus. In particular, the apparatus may be configured and arranged so as to enable the Mo coating layer to be formed on the base material by controlling the Mo target and Ar gas of the sputtering apparatus, to form a nitride film forming condition by controlling Ar gas and N$_2$ gas of the arc ion plating apparatus, to enable formation of a Cr—Mo—N nano composite coating layer on the base material by controlling the Mo target and Ar gas of the sputtering apparatus and the Ar gas, N$_2$ gas and Cr source of the arc ion plating apparatus at the same time, and to enable the Cr—Mo—N nano composite coating layer and the Mo coating layer to be formed repeatedly by revolving the base material around a central pivot within the chamber C.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuels derived from resources other than petroleum). As referred to herein, a hybrid vehicle is a vehicle that has two or more sources of power, for example both gasoline-powered and electric-powered vehicles.

BRIEF DESCRIPTION OF THE DRAWINGS

The above and other features of the present invention will now be described in detail with reference to certain exemplary embodiments thereof illustrated the accompanying drawings which are given hereinbelow by way of illustration only, and thus are not limitative of the present invention, and wherein:

FIG. 1 is a flow chart of a method for forming a coating layer with a nano multi-layer according to one embodiment of the present invention.

FIG. 2 is a configuration diagram of an apparatus for forming a coating layer with a nano multi-layer according to one embodiment of the present invention.

FIG. 3 is a microstructure picture of a coating layer with a nano multi-layer according to one embodiment of the present invention; and FIG. 4 is a graph representing the phase change of a coating layer with a nano multi-layer according to one embodiment of the present invention according to bias voltage.

It should be understood that the appended drawings are not necessarily to scale, presenting a somewhat simplified representation of various preferred features illustrative of the basic principles of the invention.

In the figures, reference numbers refer to the same or equivalent parts of the present invention throughout the several figures of the drawing.

DETAILED DESCRIPTION

Hereinafter, a method and an apparatus for forming a coating layer with a nano multi-layer according to the preferred embodiments of the present invention now will be described in detail with reference to the accompanying drawings.

FIG. 1 is a flow chart of a method for forming a coating layer with nano multi-layer according to one embodiment of the present invention. In particular, the method for forming the coating layer uses a sputtering apparatus and an arc ion plating apparatus, and comprises: a first coating step S100 of forming a Mo coating layer on a base material; a nitrating step S200 of forming a nitride film forming condition; the second coating step S300 of forming a nano composite coating layer of Cr—Mo—N on the base material; and a multi-coating step S400 of coating a multi-layer having repeating layers of Cr—Mo—N nano composite coating layer and Mo coating layer. In particular, the first coating step S100 can be carried out by the sputtering apparatus using a Mo target and Ar gas. The nitrating step S200 can be carried out by the arc ion plating apparatus using Ar gas and N$_2$ gas. The second coating step S300 can be carried out by using the Mo target and Ar gas of the sputtering apparatus and the Ar gas, N$_2$ gas and Cr source of the arc ion plating apparatus at the same time. The multi-coating step S400 can form the multi-layer by revolving the base material around a central pivot within the chamber C. An apparatus for carrying out this method is further provided.

The method for forming a coating layer with a nano multi-layer of the present invention can basically use a physical vapor deposition apparatus, a sputtering apparatus 100 and an arc ion plating apparatus 300.

FIG. 2 is a diagram of the apparatus for forming a coating layer with a nano multi-layer according to one embodiment of the present invention. According to this embodiment, the base material M is disposed within the chamber C so as to revolve on its own axis and around an interior axis at the same time in the chamber C. As shown, on one side of the base material M, the sputtering apparatus 100 and the arc ion plating apparatus 300 are separately disposed. The sputtering apparatus 100 is configured and arranged to provide a Mo target and Ar gas in the chamber C to a certain range. The arc ion plating apparatus 300 is configured and arranged to provide Ar gas, N$_2$ gas and a Cr source in the chamber C to a certain range.

Using the method and apparatus of the present invention, the base material M can be coated by the sputtering apparatus 100 while the base material M revolves, or the base material M can be coated by the simultaneous influences of the sputtering apparatus 100 and the arc plating apparatus 300. Further, according to various embodiments, the base material M can be disposed within the chamber C such that it can rotate as it is coated so that the base material M is evenly coated all over. This apparatus is considered a 'hybrid-type physical vapor deposition apparatus, and it is the apparatus which will be described as follows for forming a coating layer with a nano multi-layer of the present invention.

In particular, the present invention provides a method and apparatus for forming nano-complexation and a nano multi-layer using a functional metal (Mo). The nano-composite coating (CrMoN) and CrMoN/Mo nano multi-layer structure using Mo is formed by depositing each element using two ion sources. These layers can be formed by controlling source power, deposition time, jig rotation/revolution rate and the like (wherein the "jig" refers to a structure supporting the base material M). Further, the crystal direction can be controlled by controlling the bias voltage, thereby controlling the CrN of the main growth face to [220].

In particular, hybrid type physical vapor deposition apparatuses equipped with asymmetric magnetron sputtering and an arc ion plating (AIP), respectively, as an apparatus for coating were used.

The base material for deposition can be fixed within each effective height (120 mm) section of a target for sputtering 120 and a target for ion plating 320 using the jig, and the distance to each target 120, 320 can be controlled within about 80~150 mm, and the position of the base material M for deposition can be fixed.

According to various embodiments, the degree of the vacuum on the preparation step for deposition may be about 2*10^-2 torr, and may be controlled at this pressure to within about 4*10^-5 torr.

First of all, before forming the multi-component functional layer (also referred to herein as multi-layer and multilayer membrane), a buffer layer may be formed for improving adhesive property with a sample and the like. The buffer layer may be a metal buffer layer such as Mo or the like. In particular, the first coating step S100 may be carried out to form the Mo coating layer on the base material using the sputtering apparatus with an Mo target and Ar gas. For example, the sputtering deposition may be performed in Ar atmosphere (at about 1~100 sccm—standard cubic centimeters per minute—sputtering region) using the Mo target.

Then, the nitrating step S200 is conducted to form the nitride film forming condition. In particular, the arc ion plating apparatus may be used with Ar gas and $N_2$ gas. For example, according to various embodiments the amount of Ar gas of the sputtering region may be reduced, and Ar gas of the ion plating part may be provided at the same time with $N_2$ gas to provide the nitride film forming condition.

Then, as shown in FIG. 1, the second coating step S300 may be carried out to form the Cr—Mo—N nano composite coating layer on the base material M. This can be accomplished, for example, by using the Mo target and Ar gas of the sputtering apparatus and the Ar gas, $N_2$ gas and Cr source of the arc ion plating apparatus at the same time.

After the second coating step S300, the middle layer, which is the multi-layer, is formed in the multi coating step 400. The multi-layer may be formed having a uniform layered structure (wherein uniform layered structure can refer to alternating layers as shown, for example, in FIG. 3). According to various embodiments, a single metal composition layer of nano-scale may be formed by revolving the jig on which the base material is fixed at an appropriate rate, such as a rate of about RPM 2~10, during the deposition process.

In particular, in the multi coating step S400, the multi-layer having a repeating structure of Cr—Mo—N nano composite coating layers and Mo coating layers (e.g., as shown in the alternating layered structure in FIG. 3) can be formed by revolving the base material M around the central pivot (e.g. see central pivot H in FIG. 2). According to various embodiments, the multi coating step S400 is carried out while maintaining the deposition vacuum to about 8*10^-3 torr, while the sources of the sputtering apparatus (Mo) and the arc ion plating apparatus (Cr) are simultaneously used to form the Cr—Mo—N multi-component nano composite coating layer.

According to various embodiments, in the multi coating step S400, the sputtering apparatus and the arc ion plating apparatus may maintain an angle between central axes of the apparatuses (i.e. between the central axes of the sputtering apparatus and the arc ion plating apparatus) to about 60~120°. Such an angle is provided to allow formation of both the nano composite grain and the multi-layer membrane made of the functional metal. In particular, when the rotation of the base material M is located on an angle out of the common source supplying range of the sputtering apparatus 100 and the arc ion plating apparatus 300, the nano composite grain is formed, but the multi-layer membrane made of the functional metal is not.

Namely, the sputtering apparatus 100 and the arc ion plating apparatus 300 and configured and arranged to enable the Cr—Mo—N multi-component nano composite coating layer to be formed at an overlapped source supplying section by maintaining an angle between central axes of the apparatuses (the sputtering apparatus 100 and the arc ion plating apparatus 300) to about 60~120°. For example, when forming the Mo coating layer, coating may be conducted only at a region within the source supplying range of the sputtering apparatus 100, and preferably, while the base material M is revolving, a Mo coating layer and a Cr—Mo—N coating layer are formed during one revolution.

During the multi coating step S400, $N_2$ gas should be provided only to the arc ion plating apparatus 300 because the multi-layer made of the functional metal is not formed when $N_2$ is provided to the sputtering apparatus 100 source or to the chamber on the whole.

According to various embodiments, the bias voltage applied to the base material M in the multi coating step S400 is −250~−150 V because, at this bias voltage, the main growth face of CrN becomes [220], thereby further increasing the conductivity and the corrosion resistance.

FIG. 4 is a graph representing the phase change based on bias voltage of a coating layer with a nano multi-layer formed according to one embodiment of the present invention. As demonstrated, the conductivity and the corrosion resistance are excellent in the bias voltage range of −250~−150 V because main growth face is [111], [200] at the bias voltage of −80 V, but main growth face is [220] at the bias voltage of −200 V. It is common knowledge that CrN[220] is better than CrN[111] or CrN[200] in conductivity and the corrosion resistance.

Preferably, in the multi coating step S400, the Ar gas of the sputtering apparatus is controlled to a flow rate of about 60 sccm, and the Ar gas and $N_2$ gas of the arc ion plating apparatus are controlled to a flow rate of about 20 sccm and about 40~100 sccm, respectively.

Further, in the multi coating step S400, the power of the sputtering apparatus may be controlled to about 50~1000 W, and the Mo coating layer and the Cr—Mo—N coating layer may be alternately formed while maintaining the temperature in the chamber to about 150~350° C.

FIG. 3 is a microstructure picture of a coating layer with a nano multi-layer structure according to one embodiment of the present invention, which confirms that the relatively thick Cr—Mo—N coating layers and the relatively thin Mo coating layers are alternately coated through the multi coating step S400.

As shown is FIG. 2, an apparatus for forming a coating layer with nano multi-layer according to one embodiment of the present invention comprises: a chamber C, which is configured and arranged to house a base material M such that the base material M can revolve on its own axis and around an interior axis H at the same time; a sputtering apparatus 100; an arc ion plating apparatus 300; and a controller 700. According to a preferred embodiment, the sputtering apparatus 100 provides a Mo target and Ar gas in the chamber C to a certain range and the arc ion plating apparatus 300 provides Ar gas, $N_2$ gas and Cr source in the chamber C to a certain range. Further, the controller 70 is configured and arranged to enable the Mo coating layer to be formed on the base material M by controlling the Mo target and Ar gas of the sputtering apparatus 100, forms a nitride film forming condition by controlling Ar gas and $N_2$ gas of the arc ion plating apparatus 300, enables a Cr—Mo—N nano composite coating layer to be formed by controlling the Mo target and Ar gas of the sputtering apparatus 100 and the Ar gas, $N_2$ gas and Cr source of the arc ion plating apparatus 300 at the same time, and enables the Cr—Mo—N nano composite coating layer and the Mo coating layer to be alternately formed repeatedly by revolving the base material M around a central pivot H.

The temperature in the chamber C may be controlled by the controller 700, and the interior pivot H may be controlled by the controller 700 to enable the base material M to revolve on its own axis and around the central pivot H at the same time. As shown, the Mo target 120 is provided in the sputtering apparatus 100, and an Ar gas supplier and a power providing unit 140 are arranged in connection with the sputtering apparatus 100. As further shown, the Cr source 320 is provided in the arc ion plating apparatus 300, and Ar gas and $N_2$ gas suppliers and a power providing unit 340 are arranged in connection with the apparatus. Further, a bias voltage generator 500 providing the bias voltage to the base material M can be arranged in connection with the chamber C.

The controller 700 may be provided so as to control the operations of the sputtering apparatus 100 and the arc ion plating apparatus 300.

For example, the controller 700 may be configured and arranged to enable the Mo coating layer to be formed on the base material M by controlling the Mo target 120 and Ar gas of the sputtering apparatus 100. The controller 700 may be configured and arranged to further form a nitride film forming condition by controlling Ar gas and $N_2$ gas of the arc ion plating apparatus 300. Further, the controller may be configured and arranged to enable a Cr—Mo—N nano composite coating layer to be formed on the base material M by controlling the Mo target 120 and Ar gas of the sputtering apparatus 100, and the Ar gas, $N_2$ gas and Cr source 320 of the arc ion plating apparatus 300 at the same time. Still further, the controller may be configured and arranged to enable the Cr—Mo—N nano composite coating layer and the Mo coating layer to be alternately formed repeatedly by revolving the base material M around a central pivot H. Through this, the Cr—Mo—N nano composite coating layers and the Mo coating layers are alternately formed in a repeating layered structure as shown, for example, in FIG. 3.

The present method and apparatus for forming a coating layer with a nano multi-layer according to the structure described herein can beneficially be used for surface treatment of a fuel cell separator and can improve the weldability of the component(s) applied to the coating material by significantly improving the electrical conductivity, particularly through the nano-hybridization with a functional metal on the CrN coating layer and through control of the layered microstructure.

Further, the present methods and apparatus are provide coating layers having significantly improved corrosion resistance as compared with the conventional CrN coating layers.

While the invention have be described in conjunction with exemplary embodiments, it will be understood that present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

What is claimed is:

1. A coating layer with a nano multilayer comprising:
a multi-layer having alternating layers of a Cr—Mo—N nano composite coating layer and a Mo coating layer, wherein a main growth face of the Cr—Mo—N is [220] to meet a predetermined corrosion resistance and electrical conductivity, and the main growth face of the Cr—Mo—N corresponds to a growing surface having the highest distribution as a same type crystal among all crystals constituting the Cr—Mo—N.

\* \* \* \* \*